(12) United States Patent
Wu et al.

(10) Patent No.: US 6,286,119 B1
(45) Date of Patent: Sep. 4, 2001

(54) DELAY FAULT TESTING WITH IEEE 1149.1

(75) Inventors: Yuejian Wu, Kanata; Paul P. Soong, Nepean, both of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/218,427

(22) Filed: Dec. 22, 1998

(51) Int. Cl.[7] ............................. G01R 31/28; G06F 15/00
(52) U.S. Cl. ............................. 714/726; 712/227
(58) Field of Search .................... 714/726, 724, 714/727, 731; 703/13, 14, 15, 19; 712/220, 223, 225, 227

(56) References Cited

U.S. PATENT DOCUMENTS

| | | | |
|---|---|---|---|
| 5,396,501 | * 3/1995 | Sengoku | 714/727 |
| 5,444,715 | 8/1995 | Gruetzner et al. | 371/22.3 |
| 5,497,378 | * 3/1996 | Amini et al. | 714/727 |
| 5,574,730 | * 11/1996 | End, III et al. | 714/724 |
| 6,079,039 | * 6/2000 | Nakamura | 714/726 |

OTHER PUBLICATIONS

"AC Interconnect Test With Series Boundary Scan", P.K. Graham, IBM Technical Disclosure Bulletin, vol. 34, No. 6, Nov. 1991, pp. 325–330.

"On Delay Fault Testing in Logic Circuits", C.J. Lin et al., IEEE Transactions on Computer–Aided Design, vol. CAD–6, No. 5, Sep. 1987, pp. 694–703.

"Accelerated Path Delay Fault Simulation", Y. Wu et al., Proc. IEEE VLSI Test Symposium, Apr. 1992, pp. 1–6.

* cited by examiner

*Primary Examiner*—Christine T. Tu
(74) *Attorney, Agent, or Firm*—Angela C. de Wilton

(57) ABSTRACT

An interconnect delay test uses the IEEE 1149.1 standard test access port (TAP) controller. No modification of standard boundary cells is required. Since the standard boundary scan cells are used, circuit board and/or backplane interconnect delay tests do not affect ASIC (application specific integrated circuit) designs. It allows board and system designers to add new interconnect AC tests for any signals at any time without modification of ASICs. Since the method has no impact on the operations of the standard TAP controller, it is possible to use available test softwares for interconnect DC tests to perform the proposed delay test. The method can also be integrated as part of in-system interconnect tests.

46 Claims, 12 Drawing Sheets

DELAY FAULT TESTING WITH IEEE 1149.1

TECHNICAL FIELD

The present invention relates to interconnect delay fault test using the IEEE 1149.1 standard test access port (TAP) operations.

BACKGROUND INFORMATION

With the increasing demands for high performance, today's systems are running at faster and faster frequencies. This makes the AC performance of the interconnects on boards and backplanes more critical. Interconnect delay faults that used to be tolerable in slow systems may cause high performance systems to fail. To test for interconnect delay faults, today's common practice is to use bed-of-nails to measure the interconnect delays. Unfortunately, with the increasing usage of advanced silicon packaging technologies such as ball-grid-arrays (BGA), the applications of bed-of-nails have been significantly limited since many signals with the new packaging technologies are simply not observable on boards. In addition, the bed-of-nails approach does not cover delay faults in ASICs' (application specific integrated circuits') pad drivers and receivers damaged in the assembly process. Test vectors using bed-of-nails cannot be re-used at system levels or at customers' premises.

The causes of interconnect delay faults on boards and in systems are multiple. In the design phase, improper routings of some critical signals and/or improper terminations of these signals may contribute to excessive delays that will show up as interconnect delay faults after the board or system is assembled. Similarly, clock skews among different ASICs due to improper routings and/or unbalanced loads may even cause properly designed data signals to fail at speed. In the manufacturing phase, bad solder joints and defective tracks can cause interconnect delay faults. In addition, damaged ASIC pad drivers and receivers during board assembly and soldering process may also show up as interconnect delay faults.

In conventional manufacturing, AC performance test sometime falls between process flows. In in-circuit test station, DC characteristics (e.g. open, short, resistive and capacitive value, and analog devices) are the main targets of that stage of manufacturing. AC performance issues are usually covered in module test station or functional test station. Unless critical signals are identified and special tests are written to cover them, in general functional test on average does not have a high coverage on AC performance on most signals. With the new proposed technique, the ease of operation will make high coverage delay fault testing easily accommodated into either in-circuit test station or functional test station.

In a paper by P. K. Graham entitled "AC Interconnect Test with Series Boundary Scan", IBM Tech. Disclosure Bulletin, Vol. 34, No. 6, November 1991, boundary scan driver cells and receiver cells were described to conduct AC interconnect test. Since it requires to enable the drivers under test all the time, it is unable to detect timing faults associated with the driver enable. U.S. Pat. No. 5,444,715 granted to Gruetzner et al. on Aug. 22, 1995 discloses that different boundary scan driver and receiver cells to overcome the deficiency in Graham's paper. It intends to test if data can be delivered from a driver cell to a receiver cell in one normal system clock cycle. The boundary scan cell described in both Graham's paper and U.S. Pat. No. 5,444,715 are not IEEE 1149.1 compatible.

A recently suggested technique uses a synchronizing trigger signal to conduct interconnect delay fault test of ASICs, implementing the IEEE 1149.1 standard. It helps reduce the dependency of interconnect delay tests on bed-of-nails. Under the control of a TAP controller, a special At-Speed Interconnect (ASI) controller is used to run the delay tests. This technique requires to add an extra pin to each ASIC that will be involved in board delay tests. The extra pins from ASICs are all connected together on board to provide a global synchronization signal that triggers the delay tests. This global signal can be driven by a tester or by a master ASI controller residing in one of the ASICs on the board. Due to board level functional signals connections, these extra pins cannot be easily shared with functional pins. In addition, it also requires to replace the standard boundary scan cells with their proprietary cells for all the pins involved in board delay tests. Each of these proprietary boundary scan cells contains an extra flip-flop running at system clock plus some specialized logics. This technique will only work for interconnects between two such equipped ASICs and not with any common off-the-shelf IEEE 1149.1 compliance components.

SUMMARY OF THE INVENTION

It is an object of the present invention to provide an improved interconnect delay fault test.

According to one aspect of the present invention, there is provided a test access port (TAP) control method in use for fault test of interconnect between first and second integrated circuit (IC) chips, the method comprising the steps of: performing IEEE 1149.1 standard TAP operations wherein test clock (TCK), test mode select (TMS), TAP scan test clock (TAP—SCLK), TAP scan mode (TAP_SM) and TAP load (TAP_LO) signals are determined by standardized timing; generating a scan mode (SM) control signal in response to the TAP_SM signal; generating a load (LO) control signal in response to the TAP_LO signal; and generating a scan test clock (SCLK) control signal in response to the TCK signal and the LO control signal.

The TAP control method according to the present invention is based on the IEEE 1149.1 TAP operations to conduct fault test of interconnect between the IC chips. For example, IC chips are interconnected on a circuit board and they are ASICs (application specific integrated circuits) and commercially used chips such as CPUs (central processing units).

In the TAP control method, for example, the step of generating a scan mode (SM) control signal comprises the step of activating the SM control signal in response to the TAP_SM signal. The step of generating a load (LO) control signal comprises the step of activating the LO control signal in response to the TAP_LO signal. The step of generating a scan test clock (SCLK) control signal comprises the step of activating the SCLK control signal in response to the activated LO control signal. The LO control signal is activated in response to the succeeding edge of a pulse of the TAP_LO signal. The SCLK control signal is activated in response to the preceding edge of a pulse of the activated LO control signal with a time delay. The data stored in the boundary scan cells included in the first IC chip is transferred to the second IC chip via the interconnect between the first and second IC chips. The transferred data is captured by the second IC chip and stored in its boundary scan cells. This allows an interconnect delay fault test using the IEEE 1149.1 standard TAP operations.

According to another aspect of the present invention, there is provided an apparatus for conducting fault test of interconnect between first and second IC chips, the apparatus comprising a test access port (TAP) controller, the TAP controller performing IEEE 1149.1 standard TAP operations wherein test clock (TCK), test mode select (TMS), TAP scan test clock (TAPSCLK), TAP scan mode (TAP_SM) and TAP load (TAP_LO) signals are determined by standardized timing; the TAP controller generating means for generating scan mode (SM), load (LO) and scan test clock (SCLK) control signals, in response to the TAP_SM, the TAP_LO and the TCK signals.

In the apparatus, for example, each of the first and second IC chips comprises the TAP controller and boundary scan cells, the TAP controller comprising: means for generating the SM control signal in response to the TAP_SM signal; load control means for generating the LO control signal in response to the TAP_LO signal; and scan test clock means for generating the SCLK control signal in response to the TCK signal and the LO control signal. The TAP controller of the first IC chip further includes means for transferring data stored in the boundary scan cells of the first IC chip to the boundary scan cells of the second IC chip via the interconnect between the first and second IC chips. The TAP controller of the second IC chip further includes means for capturing the data transferred from the first IC chip. The LO control signal is activated in response to the succeeding edge of a pulse of the TAP_LO signal. The SCLK control signal is activated in response to the preceding edge of a pulse of the activated LO control signal with a time delay.

The TAP controller further includes means for storing data in the boundary scan cells, the data being transferred from the second IC chip via the interconnect between the first and second IC chips. The TAP controller further includes means for capturing the data stored in the boundary scan cells.

The TAP controller functions entirely the IEEE 1149.1 standard TAP operations and generates the control signals. The TAP controller may be consist of two function blocks. One performs the IEEE 1149.1 standard TAP operations to generate the IEEE 1149.1 standard TAP signals. The other one generates the control signals in response to the IEEE 1149.1 standard TAP signals.

According to another aspect of the present invention, there is provided a method for performing IEEE 1149.1 standard TAP operations, the method comprising the steps of: performing as defined by the IEEE 1149.1 standard, so that test clock (TCK), test mode select (TMS), TAP scan test clock (TAP_SCLK), TAP scan mode (TAP_SM) and TAP load (TAP_LO) signals are determined by standardized timing; generating a scan mode (SM) control signal which is activated in response to the transition of a pulse of the TAP_SM signal; generating a load (LO) control signal which is activated in response to the transition of a pulse of the TAP_LO signal; and generating a scan test clock (SCLK) control signal which is activated in response to the transition of a pulse of the activated LO control signal. The method may be implemented into a TAP controller for use in fault test of interconnect between IC chips. Also, the method is applicable to the TAP control method and the apparatus for conducting fault test of interconnect between IC chips according to the other aspects of the present invention.

BRIEF DESCRIPTION OF THE DRAWINGS

Embodiments of the present invention will now be described by way of example with reference to the accompanying drawings in which.

DETAILED DESCRIPTION

I. IEEE 1149.1 TAP Operations

Figure 1:
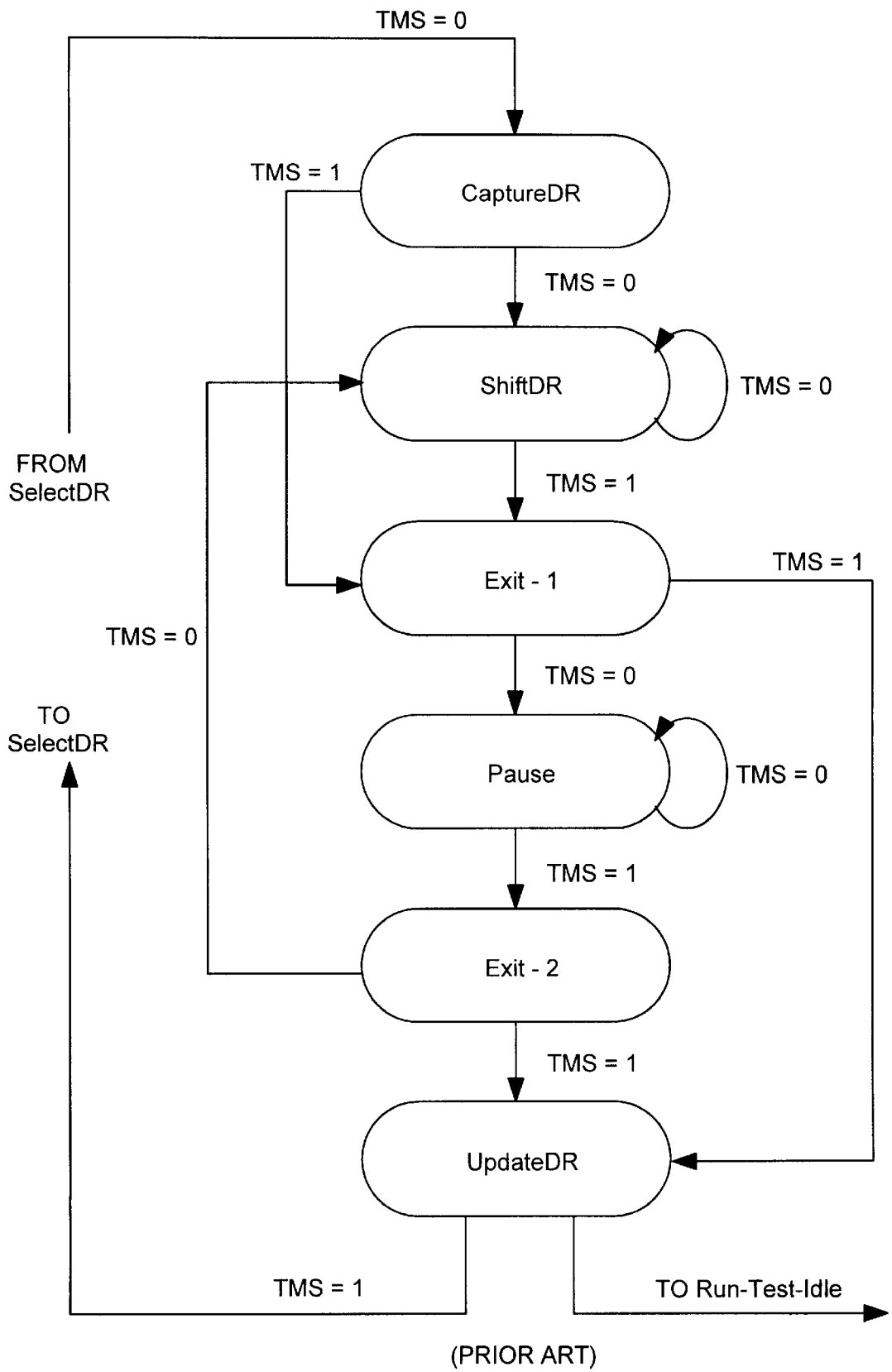
FIG. 1 illustrates the IEEE 1149.1 TAP state transition for data registers.

FIG. 1 shows the IEEE 1149.1 TAP state transitions for registering data. State CaptureDR causes all boundary scan cells to capture the data at their data input on the rising edge of the test clock (TCK). During this event the scan mode (SM) signal (ShiftDR in IEEE 1149.1 document) to all boundary scan cells is 0. During the UpdateDR state and on the falling edge of the test clock, all boundary scan cells for output and I/O pads which participate for output place the data in their scan flip-flops onto the circuit tracks on a board. The data will remain on the tracks until falling edge of the TCK signal in the next UpdateDR state.

As shown in the state diagram, after a test vector has been placed on the board interconnects, it takes at least 3 TCK cycles for the TAP to go from the UpdateDR state to the CaptureDR state. Since UpdateDR triggers the boundary scan chain to update upon the falling edge of the TCK signal but CaptureDR triggers the chain to capture on the rising edge of the TCK signal, it takes at least 2.5 TCK cycles before the test response can be sampled by the receiving boundary scan cells after it has been launched. In practice, the test clock is usually running at much slower frequencies than system clocks. However, the delays of board interconnects are usually less than a system clock cycle. Therefore, it is impossible to perform interconnect delay tests with the TAP without enhancement.

II. First Embodiment

Figure 2:
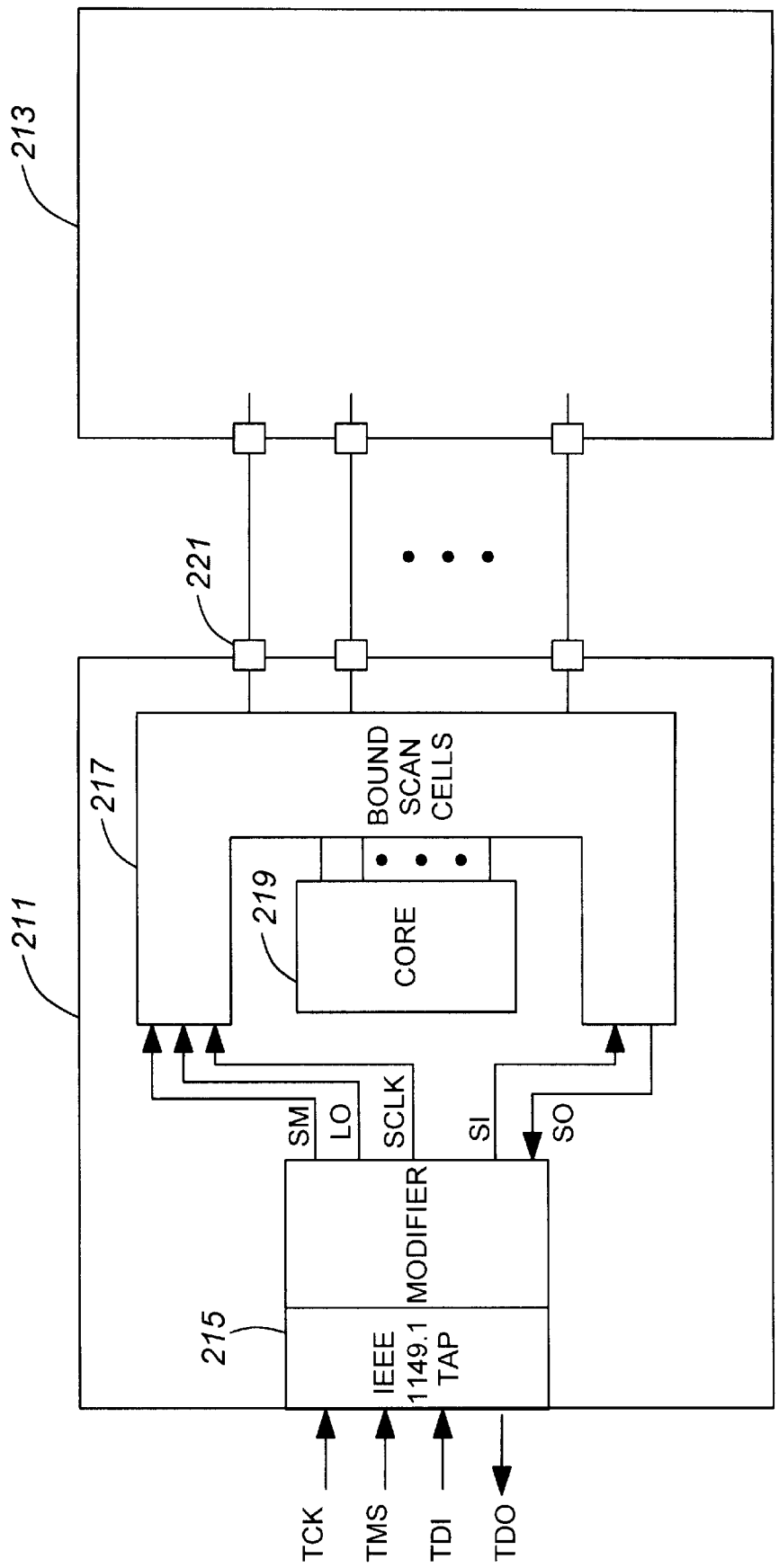
FIG. 2 illustrates two interconnected IC chips wherein an interconnect delay fault test method according to one embodiment of the present invention is implemented.

FIG. 2 shows two interconnected IC chips on a board, wherein an interconnect delay fault test method according to one embodiment of the present invention is implemented. In FIG. 2, sending and receiving IC chips 211 and 213 are ASICs with delay test enhancement. Each of the IC chips 211 and 213 includes a TAP controller 215 including an IEEE 1149.1 standard TAP controller for performing IEEE 1149.1 standard TAP operations and an associated modifier for modifying standard TAP signals.

Figure 3:
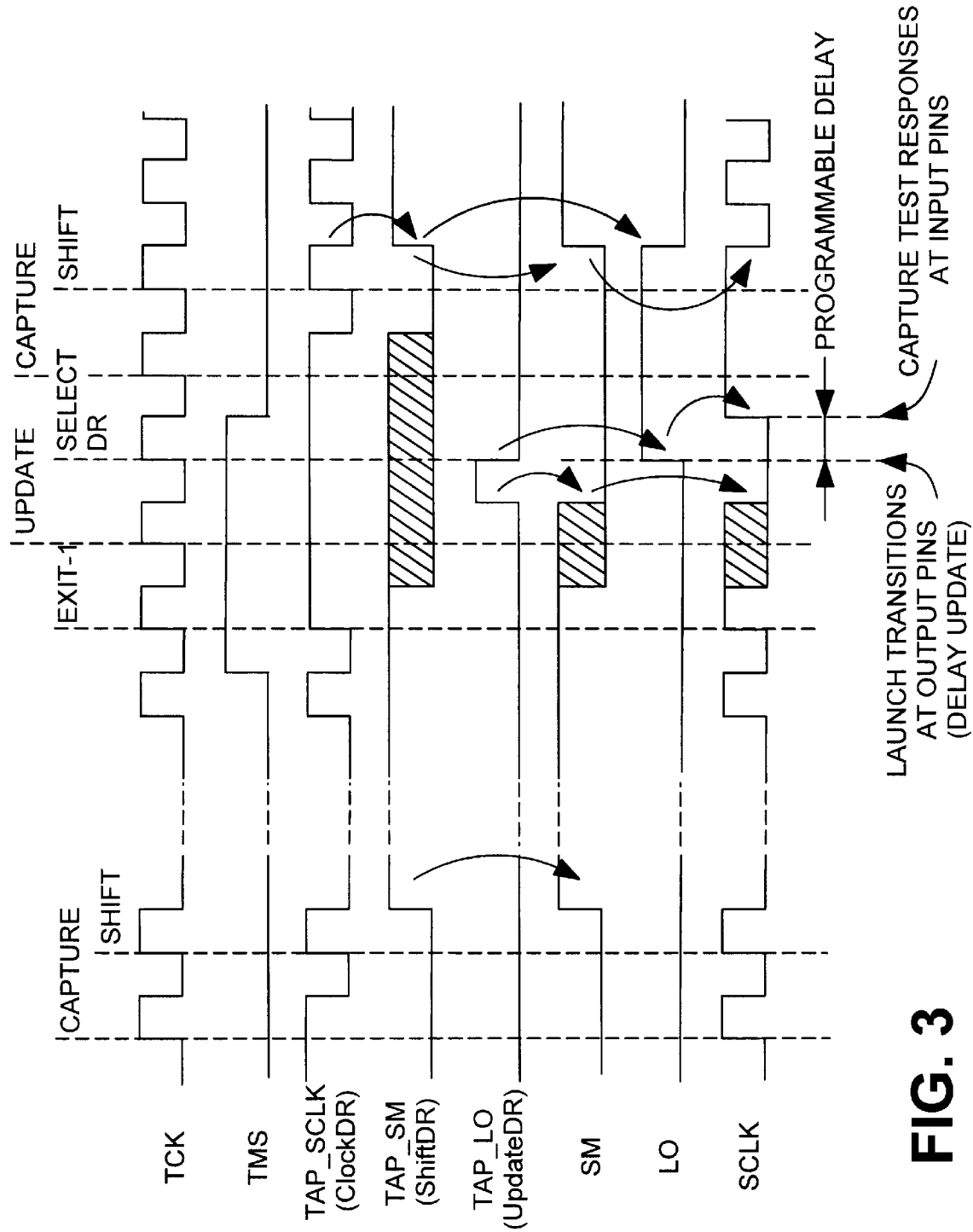
FIG. 3 shows signal waveforms in an interconnect delay fault test method according to one embodiment of the present invention.

The test clock (TCK), test mode select (TMS), TAP scan test clock (TAP_SCLK), TAP scan mode (TAP_SM) and TAP load (TAP_LO) signals are determined by standardized timing shown in FIG. 3. Also, the TAP controller 215 generates boundary scan control signals: a load control signal LO, a scan test clock control signal SCLK and a scan mode control signal SM, in response to the TCK, TMS, TAP_SCLK, TAP_SM and TAP_LO signals. The boundary scan control signals are provided to boundary scan cells 217 included in the IC chip 211. In test mode operation, the boundary scan cells 217 receive input data from a scan input TDI pin of the sending IC chip 211 and forward the data to a respective pad 221 thereof which are interconnected to the counterparts of the receiving IC chip 213.

FIG. 3 shows waveforms of the boundary scan control signals in IEEE standard timing (shown at TAP_SCLK, TAP_SM, TAP_LO) and in delay test mode with modified early capture (shown as SCLK, SM, LO). In Figure, the shaded areas represent the regions where the corresponding signals could be either constant 1 or constant 0, due to different interpretations of IEEE 1149.1 standard.

Referring to FIG. 3, under normal IEEE 1149.1 standard operation, each of the boundary scan cells updates upon the rising edge of the load signal TAP_LO (defined as Update DR in the IEEE document) and captures at the rising edge of the scan test clock control signal TAP_SCLK (defined as ClockDR in the IEEE document) when the scan mode signal TAP_SM (defined as ShiftDR in the IEEE document) is 0. Each cell shifts at the rising edge of the scan test clock control signal TAP_SCLK when the scan mode signal TAP_SM is 1.

In the operations defined in the IEEE 1149.1, it takes at least 2.5 TCK cycles to capture a test response after a test has been launched. To avoid the 2.5 TCK cycle delay, the basic idea of the inventions to have the event of launching a test and the event of capturing its test response both be triggered by the same UpdateDR state in a special delay test mode. In order to avoid the test response captured in delay test be corrupted by the normal CaptureDR state defined the transition diagram, it is necessary to hide the effect of this normal CaptureDR operation. It is important to point out that hiding the normal CaptureDR operation only occurs after each UpdateDR state in order to be compatible with standard DC test softwares.

As shown in FIG. 3, the boundary scan control signals (LO, SCLK and SM) differ from their counterparts (TAP_LO, TAP_SCLK and TAP_SM) only for the UpdateDR state and the following captureDR state. No extra state is introduced, which makes it possible to use interconnect DC test softwares to conduct AC test. The scan mode control signal SM is activated (from 0 to 1), in response to the preceding (rising) edge of a pulse of the TAP_SM signal. The activated scan mode control signal SM is deactivated (from 1 to 0), in response to the preceding (rising) edge of a pulse of the TAP_LO signal. The load control signal LO is activated (from 0 to 1), in response to the succeeding (falling) edge of a pulse of the TAP_LO signal. The activated load control signal LO is deactivated (from 1 to 0) in response to the preceding (rising) edge of the TAP_SM signal. The scan test clock control signal SCLK is activated (from 0 to 1), in response to the preceding (rising) edge of a pulse of the activated load control signal LO with predetermined time delays. The activated scan test clock control signal SCLK is deactivated (from 1 to 0), in response to the preceding (rising) edge of a pulse of the activated scan mode control signal SM.

Each delay test consists of a pair of test vectors V1 and V2 (see C. J. Lin et al., "On Delay Fault Testing in Logic Circuits", IEEE Trans. CAD, September, 1987, pp. 694–703 and Y. Wu et al., "Accelerated Path Delay Fault Simulation", Proc. IEEE VLSI Test Symposium, April 1992, pp. 1–6). V1 initiates the fault to be tested and V2 triggers the fault. For example, to test for 0-to-1 transition on a track, V1 is required to place a 0 on the track and V2 forces this track to 1 so as to launch a 0-to-1 transition.

For now, it is assumed that both TAP and boundary scan chains have been initialized, i.e., (a) all chains have been properly configured so that no two drivers drive a same net on a board; (b) EXTEST (IEEE 1149.1 standard definition) mode has been set; (c) delay test mode has been set; and (d) programmable delay has been set.

With the assumptions made above, delay test with a test pair i works as follows:

(i) Shift in the first test vector V1(i) for test pair i and update all the boundary scan cells. Due to the modifications shown in FIG. 3, updating V1(i) also trigger a capture event. This capture event simply captures don't cares since useful test response for the current test pair occurs only after its second vector V2(i) is applied. However, this capture event can be used to capture the test response of test pair i−1 if V2(i−1) is compatible with V1(i), i.e., if it is possible to make V2(i−1)=V1(i).

(ii) Shift in the second test vector V2(i) for test pair i and update all the boundary scan cells. This update event launches transitions onto the tracks and also causes the receiving boundary scan cells of the receiving chip 213 to capture the test response after a pre-defined delay. As shown in FIG. 3, the normal CaptureDR state following this update event is disabled so as to preserve the captured test responses.

(iii) Shift out the test response for analysis. It should be pointed out that the number of TCK cycles for shifting in test vectors and shifting out test responses is the same as that for conventional interconnect DC tests. This is because the delay test mode does not change the shift operations of the TAP controller. In addition, the control sequences for TCK and TMS remain the same as for interconnect DC tests.

Figure 4:
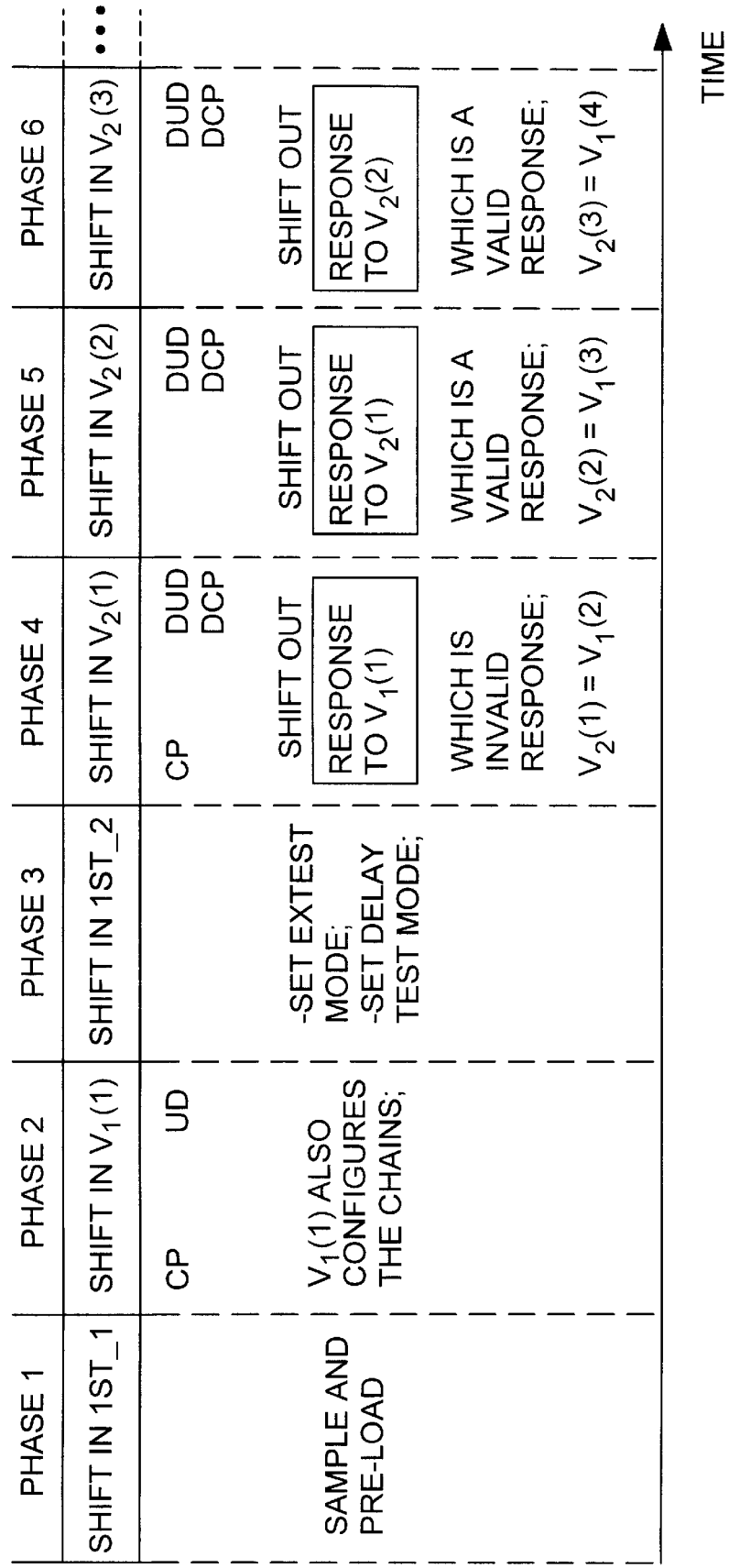
FIG. 4 shows a procedure in the interconnect delay fault test method.

The above has shown how to run the delay test for a single test pair. FIG. 4 shows a full picture as how to run a complete delay test of many test pairs. For simplicity, it is assumed that that the second vector V2(i) for test pair i can also be used as the first vector V1(i+1) for the following test pair, i.e., assuming V2(i)=V1(i+1). If this is not true, the test will simply take longer time.

Each phase of the operations shown in FIG. 4 is described as follows:

Phase 1: shift in an instruction. This is the normal sample and pre-load in the DC test.

Phase 2: shift-in a V1(1). V1(1) will also configure the boundary scan chains so that no two drivers drive the same net. At the end of this phase, a normal UpdateDR, denoted as ud in FIG. 4, places V1(1) onto the interconnects on a board.

Phase 3: shift in another instruction. This instruction accomplishes three things: (a) it sets the EXTEST mode (the same as for interconnect DC tests); (b) it sets the delay test mode; and (c) it selects a proper delay for the delay test or define the programmable delays shown in FIG. 3.

Phase 4: the first operation in phase 4 is a normal CaptureDR (denoted as cp in FIG. 4). This cp captures the response of V1(1). The captured data is essentially don't cares since useful test response for the first test pair occurs only after its second vector V2(1) is applied. After shifting in V2(1), the last operation in this phase is an update. This update is a delay test update, denoted as dud in FIG. 4. It updates vector V2(1) into all boundary scan cells to launch transitions. In addition, it also triggers a delay test capture event dcp to capture the test response of V2(1). At the end of phase 4, the data in the boundary scan chain is ready to shift out for analysis.

Phase 5: as shown in FIG. 4, the normal CaptureDR event is disabled. This is to preserve the data captured by the previous dcp. In this phase, the captured data in phase 4 is shifted out for analysis. In addition, a new test vector for the second test pair is shifted in. That is V2(2). At the end of this phase, a dud launches transitions and a dcp captures the responses of these transitions.

Phase 6 and on are simply the repeat of phase 5.

As described above, the interconnect delay test is fully transparent to testers and test bus masters. One can use conventional DC test software to apply the delay test.

Figure 5:
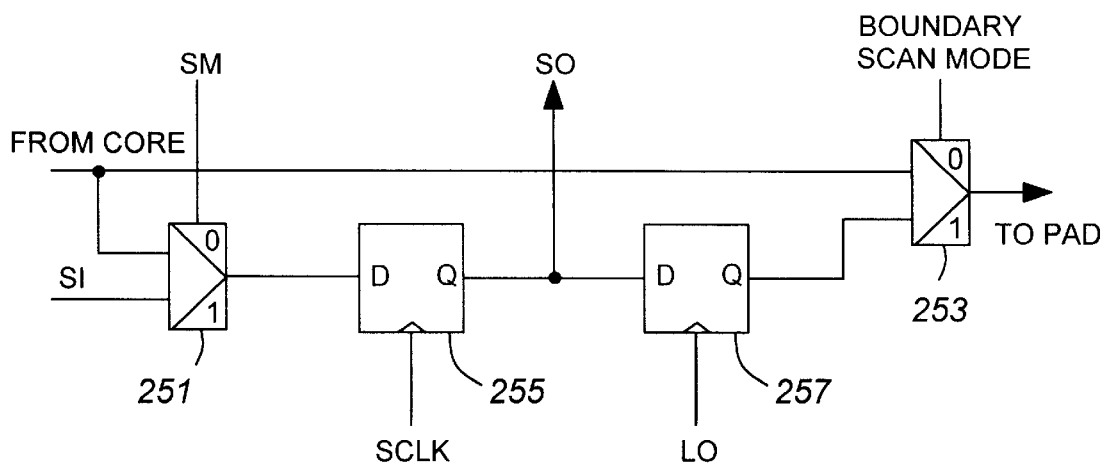
FIG. 5 is a block diagram of an example of a boundary scan cell which is incorporated in the IC chip shown in FIG. 2.

FIG. 5 shows the boundary scan cell of the IC chip. In FIG. 5, input data from the chip core circuit 219 shown in FIG. 2 is fed to the 0 input terminal of selectors 251 and 253. The scan input data SI is fed to the 1 input terminal of the selector 251. The scan mode signal SM is fed to the selection terminal of the selector 251, the output of which is fed to the D input terminal of a D-type flip-flop (D-FF) 255. The scan test clock control signal SCLK is fed to the clock terminal of the D-FF 255, the non-inverting output Q of which is scan output data SO and fed to the D input terminal of another D-FF 257. The load control signal LO is fed to the clock terminal of the D-FF 257, the non-inverting output Q of which is fed to the 1 input terminal of the selector 253. A boundary scan mode signal from the TAP controller 215 is fed to the selection terminal of the selector 253, the output of which is provided to the pad 221 of the IC chip.

Figure 6:
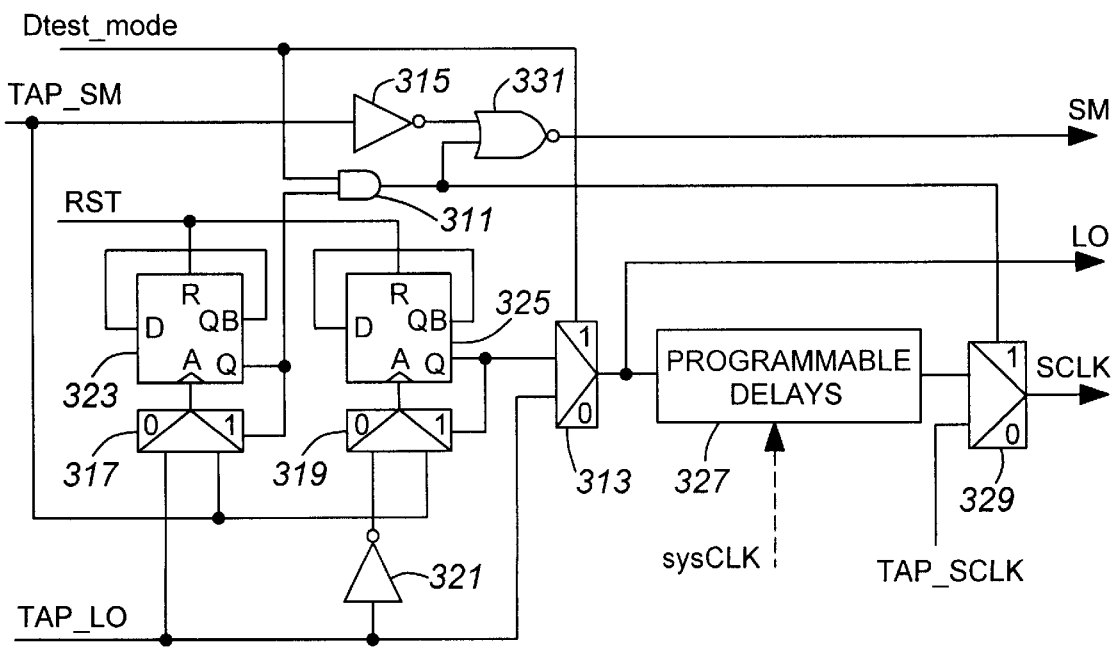
FIG. 6 is a block diagram of an example of a circuit to implement the operation shown in FIG. 3.

FIG. 6 shows a simple circuit that is able to transform the control signals from a standard TAP controller to the waveforms defined in FIG. 3. The circuit shown in FIG. 6 is one example of the modifier of the TAP controller 215 shown in FIG. 2. In FIG. 6, a delay test mode signal Dtest_mode is fed to an AND gate 311 and the selection terminal of a selector 313. The TAP_SM signal is fed to an inverter 315 and the 1 input terminals of two selectors 317 and 319. A TAP_LO signal is fed to the 0 input terminals of the selectors 317 and 313 and an inverter 321, the inverted output of which is fed to the 0 input terminal of the selector 319. A reset signal RST is fed to the reset terminals R of two D-FFs 323 and 325. The non-inverted output Q of the D-FF 323 is fed to the AND gate 311 and the selection terminal of the selector 317. The non-inverted output Q of the D-FF 325 is fed to the selection terminal of the selector 319 and the 1 input terminal of the selector 313. The inverted outputs QB of the D-FFs 323 and 325 are fed to the respective D inputs thereof. The outputs of the selectors 317 and 319 are fed to the clock terminals of the D-FFs 323 and 325, respectively. The output of the selector 313 is a load control signal LO and fed to a programmable delay circuit 327 which operates in response to a system clock signal sysCLK. The output of the programmable delay circuit 327 and a TAP_SCLK signal are fed to the 1 and 0 input terminals of a selector 329, respectively, to the selection terminal of which an output of the AND gate 311 is fed. The outputs of the AND gate 311 and the inverter 315 are fed to a NOR gate 331, the output of which is a scan mode control signal SM. The output of the selector 329 is a scan test clock control signal SCLK.

In a non-delay test mode, the delay test mode signal Dtest_mode is 0 and it is ensured that all control signals from the TAP controller go directly to the boundary scan cells. Since Dtest_mode=0, the selector 313 selects the TAP_LO signal as the load control signal LO. The output of the AND gate 311 is 0 and the selector 329 selects the TAP_SCLK signal as the scan test clock control signal SCLK. The scan mode control signal SM provided by the NOR gate 331 is equivalent to the TAP_SM signal.

In a delay test mode, the delay test mode signal Dtest_mode is 1, which can set by a TAP instruction or a user-defined test data register (TDR). The D-FFs 323 and 325 are initially reset to 0 upon TAP reset. Thus, without a rising edge on the TAP_LO signal, all the TAP control signals feed directly to the boundary scan cells.

Upon the arrival of a first rising edge on the TAP_LO signal, the Q output of the D-FF 323 goes to 1. This forces the scan mode control signal SM to be 0 and the scan test clock control signal SCLK to follow the output signal from the programmable delay circuit 327. At this time, LO=SM=SCLK=0. Now, all the boundary scan cells are ready to launch a test on the rising edge of the load control signal LO and to capture test response on the rising edge of the scan test clock control signal SCLK.

When the TAP_LO signal falls, its falling edge set the D-FF 325 to 1 (i.e., the Q output thereof is 1). This 0-to-1 transition on the Q output of the D-FF 325 sends a rising edge to the load control signal LO, which in turn updates all boundary scan cells and places the test vector shifted in onto the tracks under test. In the mean time, this 0-to-1 transition of the Q output of the D-FF 325 also goes to the programmable delay circuit 327. After a pre-defined delay, it forces the scan test clock control signal SCLK to go from 0 to 1. This rising edge of the scan test clock control signal SCLK causes all boundary scan cells to capture their data inputs since the scan mode control signal SM is 0 at the moment.

After this, the TAP controller 215 may go through some intermediate states and then go into the normal captureDR state. The normal captureDR state will enable the TAP_SCLK signal and forces the TAP_SM signal to go low for a TCK cycle. During this cycle (known as mission cycle), the Q output of the D-FF 323 is still equal to 1. This ensures that the scan test clock control signal SCLK remains 0, which in turn ensures all boundary scan cells to hold their data and ignore the normal mission cycle. After this so-called mission cycle, the TAP controller goes into shiftDR states, which set TAP_SM=1. The rising edge on the TAP_SM signal set both D-FFs 323 and 325 to 0. In turn, the Q output of the D-FF 323 being 0 forces SM and SCLK to follow the TAP_SM and TAP_SCLK signals, respectively. Now, the data captured in the boundary scan cells are shifted out for analysis one bit at a time with each rising edge of the scan test clock control signal SCLK. It is worth pointing out that after the rising edge on the TAP_SM signal, both D-FFs 323 and 325 are back to their initials states and ready for a next test vector.

The arrows shown in FIG. 3 indicates the timing relationship of the circuit shown in FIG. 6. As shown, no race condition exists in the circuit.

In the method, no extra pin is required. Instead, the TCK is used as the synchronization on boards since the TCK signal is readily routed to every single ASIC for interconnect DC tests. In reality, the routing of the TCK signal may have skews when it reaches each ASIC. Moreover, additional skews may also be added due to internal delays of this signal in different ASICs. To more accurately test for delay faults, these skews must be considered. the following are some solutions.

One possible solution is to directly drive TCK at each ASIC. In manufacturing test, bed-of-nails can be used to directly drive the TCK right at the edge of each ASIC on a board if probe pads are provided for this purpose on the board. This will help reduce the impact of skew due to the routing of the TCK signal. However, skews due to internal delays of TCK in each ASIC still exist even though they are usually fairly small in practice.

Another deficiency of this approach is its poor portability since it relies on bed-of-nails to provide the synchronization.

Another solution to reduce the impact of skew is to further synchronize the delay test with system clocks. In most applications when a board is in mission, signals are usually synchronized at the corresponding system clock edges. For example, a data is launched at the rising edge of a system clock. This data is usually sampled by receivers at the rising edge of its next system clock cycle. As long as the transmitted data is able to propagate to the receivers within a system clock cycle, it is considered valid functionally. This is true even if the system clock may also have skews itself. Therefore, in test mode, it can mimic the system operation by synchronize the signal to LO and to the Programmable Delay with the system clock. This is accomplished by adding a D-FF 411 between the D-FF 325 and the selector 313 as shown in FIG. 7 (to be after, the D-FF 411 can also be replaced with a pair of back-to-back flip-flops both running at system clock).

Figure 7:
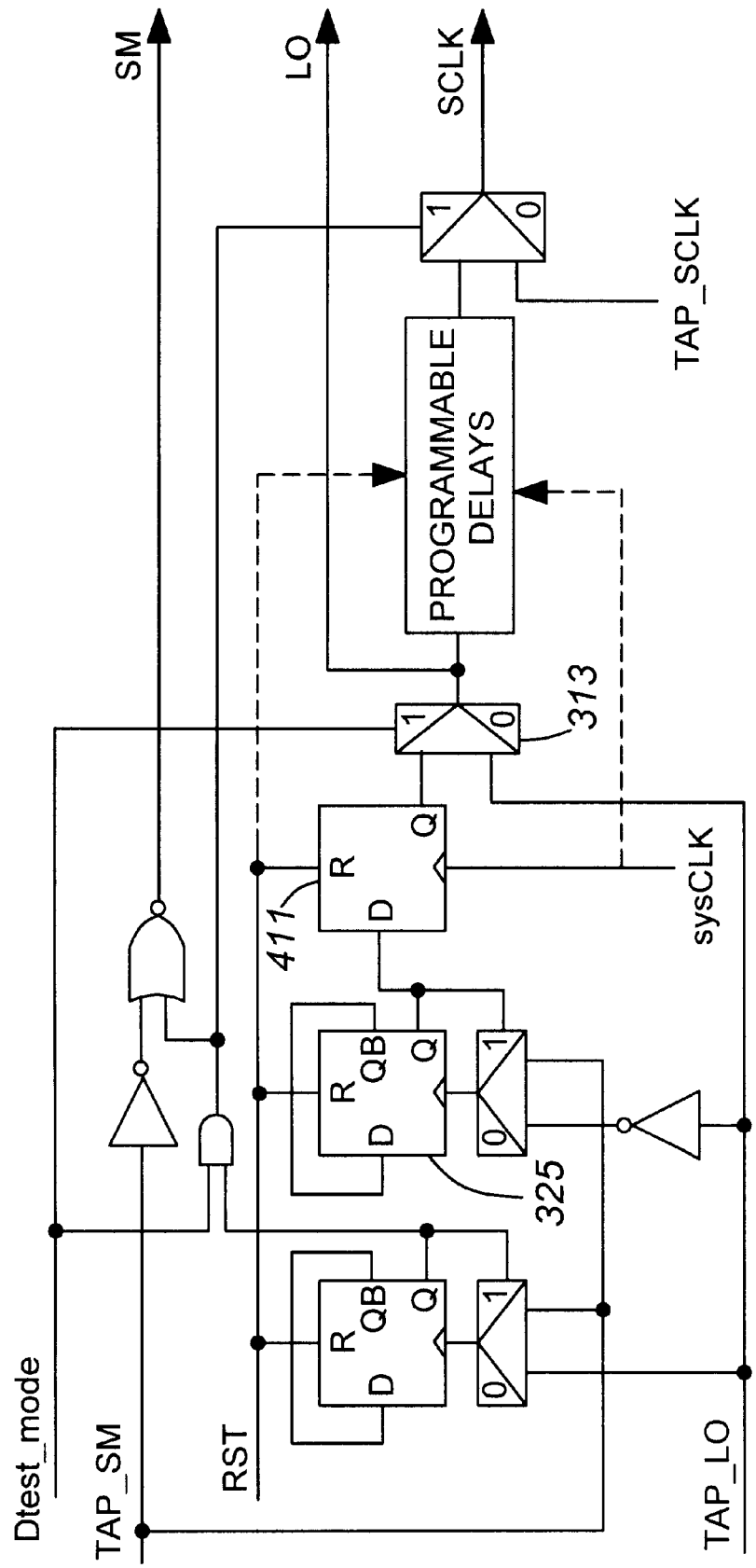
FIG. 7 is a block diagram of an example of a circuit for synchronizing boundary scan control signals.

FIG. 7 shows another example of the modifier of the TAP controller 215 shown in FIG. 2. Referring to FIG. 7, the signal to both LO and the Programmable Delays are synchronized with the rising edges of the system clock sysCLK. This ensures the test launch events to be in synchronization with the system clock. The events of capturing test responses now depends on the programmable delay circuit. As will be shown in the next section, it is possible to synchronize the capture events with different edges of the system clock.

There are many ways to realize the programmable delays depending on test requirements. For example, for most applications, one may want to delay the capture of test responses by a system clock cycle. In other words, launch a test at the rising edge of a system clock cycle and capture its response at the rising edge of the next system cycle. However, if one wants to check longer delays such as delays across backplanes or through components, it may require to delay the capture by a few clock cycle. On another hand, if one wants to measure true delay of a track or even an internal signal, it would require much finer delay of the capture.

There are other possible ways for different scenarios. Each solution is presented in isolation. However, they can be combined together and selectively used or cancatenated. The selection can be done using a control TDR that decides which delay mode to use.

Figure 8:
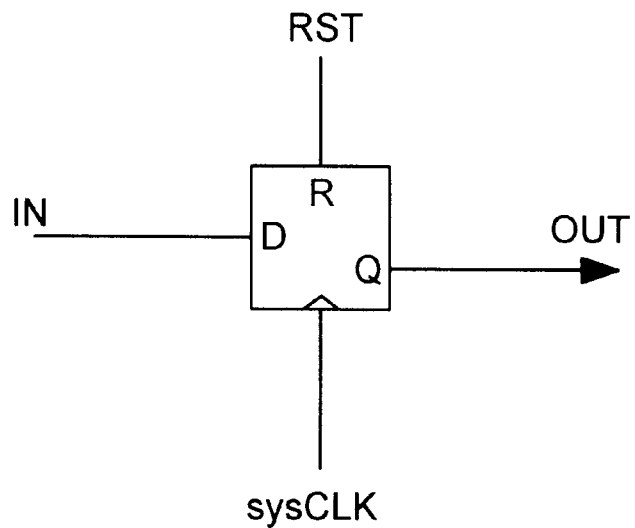
FIG. 8 shows a delay circuit.

For most synchronous designs, it is desirable to delay the capture of test response by a full system clock cycle. This ensures that a test is launched at the rising edge of a system clock and its response is captured at the rising edge of next system clock cycle. A delay circuit for such requirement is shown in FIG. 8. The delay circuit includes one D-FF. The input data fed to the D input terminal of the D-FF is clocked by the system clock signal sysCLK fed to the clock terminal of the D-FF and delayed output is provided from the D-FF's Q output terminal.

Figure 9:
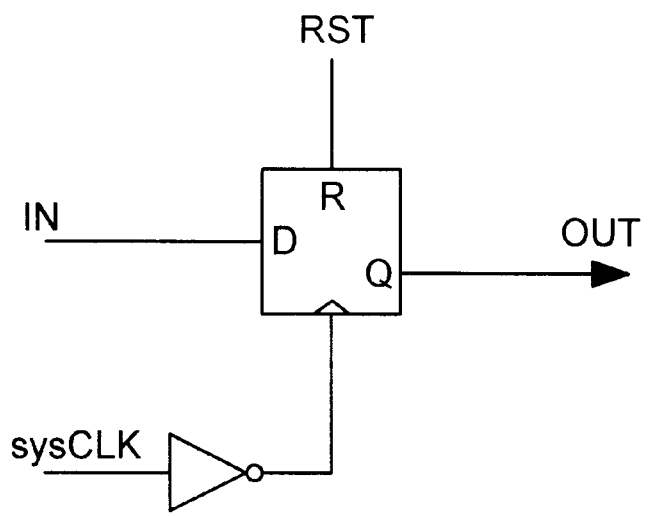
FIG. 9 shows another delay circuit.

In some systems, signals might be transmitted at the rising edges of a system clock but they are sampled by receivers at the falling edges of the same system clock cycle. In this case, a delay circuit shown in FIG. 9 may suffice for delay by half a system clock cycle. The delay circuit includes one D-FF and one inverter. The system clock signal sysCLK is via the inverter to the clock terminal of the D-FF. The input data fed to the D input terminal of the D-FF is clocked by the inverted system clock signal sysCLK fed to the clock terminal of the D-FF and delayed output is provided from the D-FF's Q output terminal.

To test an interconnect delay across a backplane or through some components, it may require to delay the capture event by a few system clock cycles. In this case, an easy solution is to use a small counter that runs at the system clock but is enabled by the signal from the D-FF 411 shown in FIG. 7 for delay by a number of clock cycles.

Figure 10:
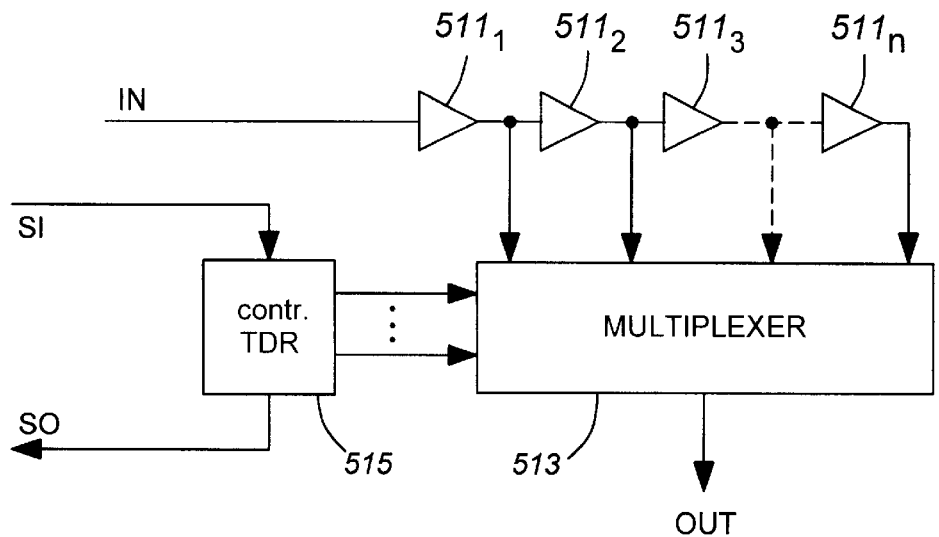
FIG. 10 is a block diagram of a finer delay circuit.

To check for the at-speed performance, it may be sufficient to delay the capture by half, full or a few system clock cycle depending on the applications. If finer delays are required for some reason, say for actual delay measurement as opposed to at-speed test, a circuit shown in FIG. 10 is useful. In FIG. 10, the programmable delay circuit includes a series of n delay elements $511_1$–$511_n$, the taps of which are connected to a multiplexer 513. A control test data register (TDR) circuit 515 receives scan input data SI and provides scan output data SO and also, provides multiplexing control signals to the multiplexer 513. A data input signal in from the selector 313 (FIG. 6) is fed to the series of the n delay elements $511_1$–$511_n$. The outputs of the n delay elements are fed to the multiplexer 513 and in response to the multiplexing control signal from the control TDR circuit 515, a selected delay output signal is provided as output signal from the multiplexer 513.

Figure 11:
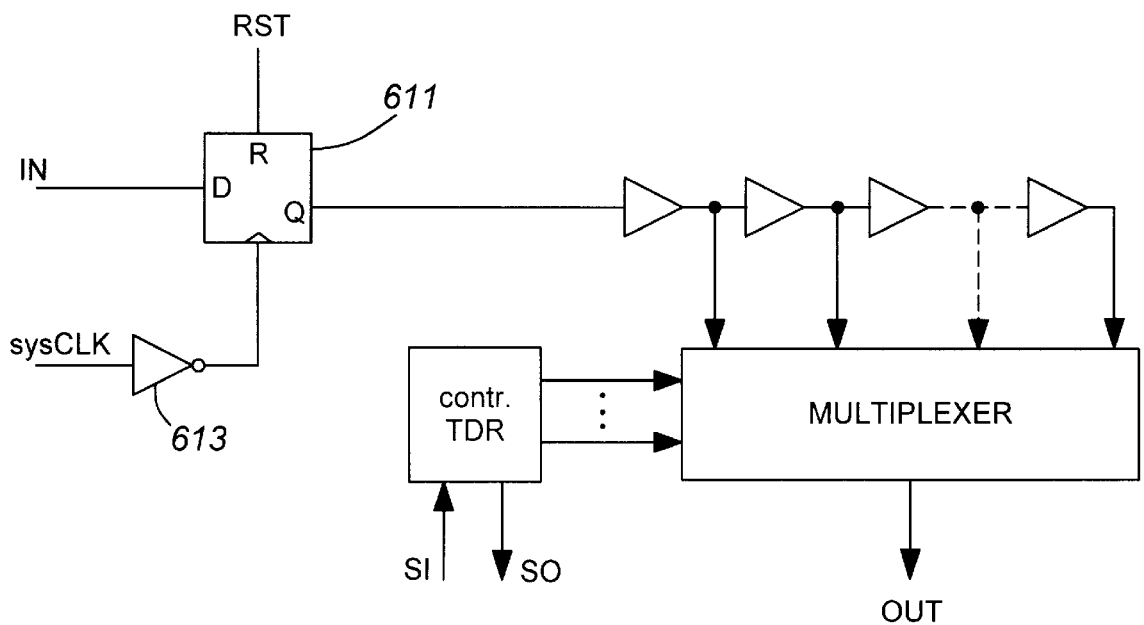
FIG. 11 is a block diagram of a concatenated delay circuit.

The programmable delays described earlier can be concatenated. For example, to provide a delay which is greater than half a system clock cycle but smaller than a full system clock cycle, a concatenated delay shown in FIG. 11 can be used. In FIG. 11, the data input signal in is fed to the D input terminal of a D-FF 611. The system clock signal sysCLK is inverted by an inverter 613 and the inverted clock signal is fed to the clock terminal of the D-FF 611, the non-inverted output Q is fed to the series of n delay elements $511_1$–$511_n$.

Using the previously mentioned method, interconnect delay fault testing can be easily accommodated in the boundary scan interconnect test. During test, drivers in an ASIC create transitions on the tracks under test and receivers in the same or in another ASIC capture the transitions. As shown in FIG. 3, both the launch and the capture of the transitions are operated with the modified waveforms from the standard TAP controller. Therefore, it is necessary to include the delay fault testing capability in both the transmitting and receiving ASICs. For the circuit boards with both ASICs with the delay testing capability and commercial ICs without such capability, the proposed technique is difficult to apply.

III. Second Embodiment

The intent of this section is to extend the proposed technique to work with commercial ICs for interconnect delay fault testing.

Figure 12:
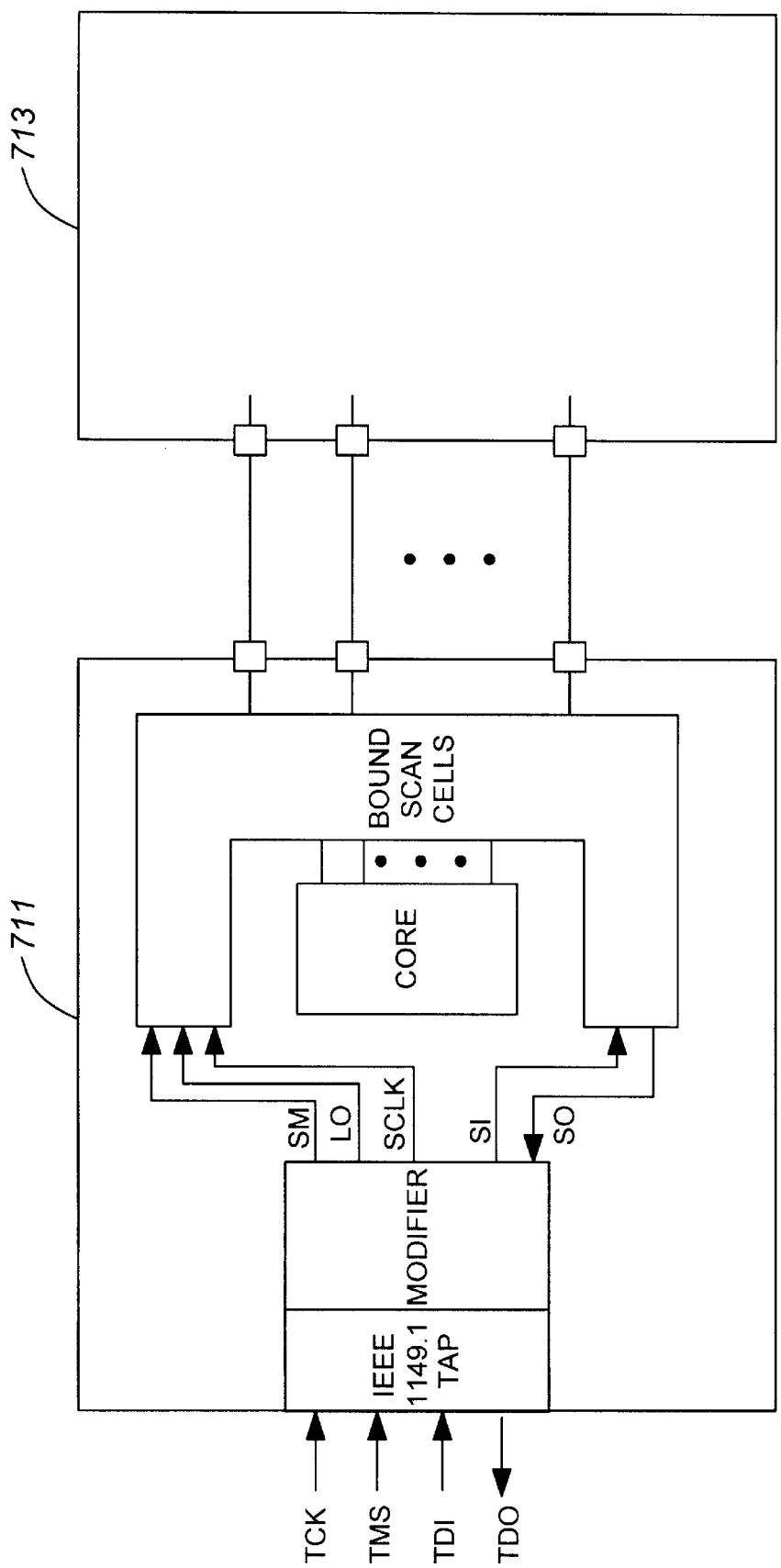
FIG. 12 illustrates two interconnected IC chips wherein an interconnect delay fault test method according to another embodiment of the present invention is implemented.

FIG. 12 shows another embodiment wherein two IC chips are interconnected. In FIG. 12, IC chips 711 and 713 are receiving and sending chips, respectively. The sending chip 713 is a commercially available chip with the IEEE 1149.1 standard TAP controller, for example, a CPU. The receiving chip 711 is identical to the IC chip 211, ASIC, shown in FIG. 2. The chip 711 includes a TAP controller which is the same as the TAP controller 215 shown in FIG. 2. The TAP controller includes an IEEE 1149.1 standard TAP controller for performing IEEE 1149.1 standard TAP operations and an associated modifier for modifying standard TAP signals.

Where the IC chip 713 transmits a transition and the IC chip 711 with the delay testing capability captures the transition. The ASIC chip 711 can also transmit transitions and capture the transitions. The technique discussed hereinafter also covers paths between ASICs with the delay testing capability.

In FIG. 3, the signal LO is modified from the TAP_LO signal (UpdateDR) and used to launch transitions to the tracks under test. The need for the modification is due to the grey area of the TAP_SM signal (ShiftDR). During the grey area, the TAP_SM signal can fall to 0 at any time since the IEEE 1149.1 standard does not provide definition for this signal during the area. However, if it is assumed that this TAP_SM signal transits to 0 at the exit-1 state, i.e., the earliest possible time in the grey area as suggested by the IEEE 1149.1 standard, it will not require to modify signal LO. Instead, it can use the waveforms defined in FIG. 13 to conduct interconnect delay fault testing.

Figure 13:
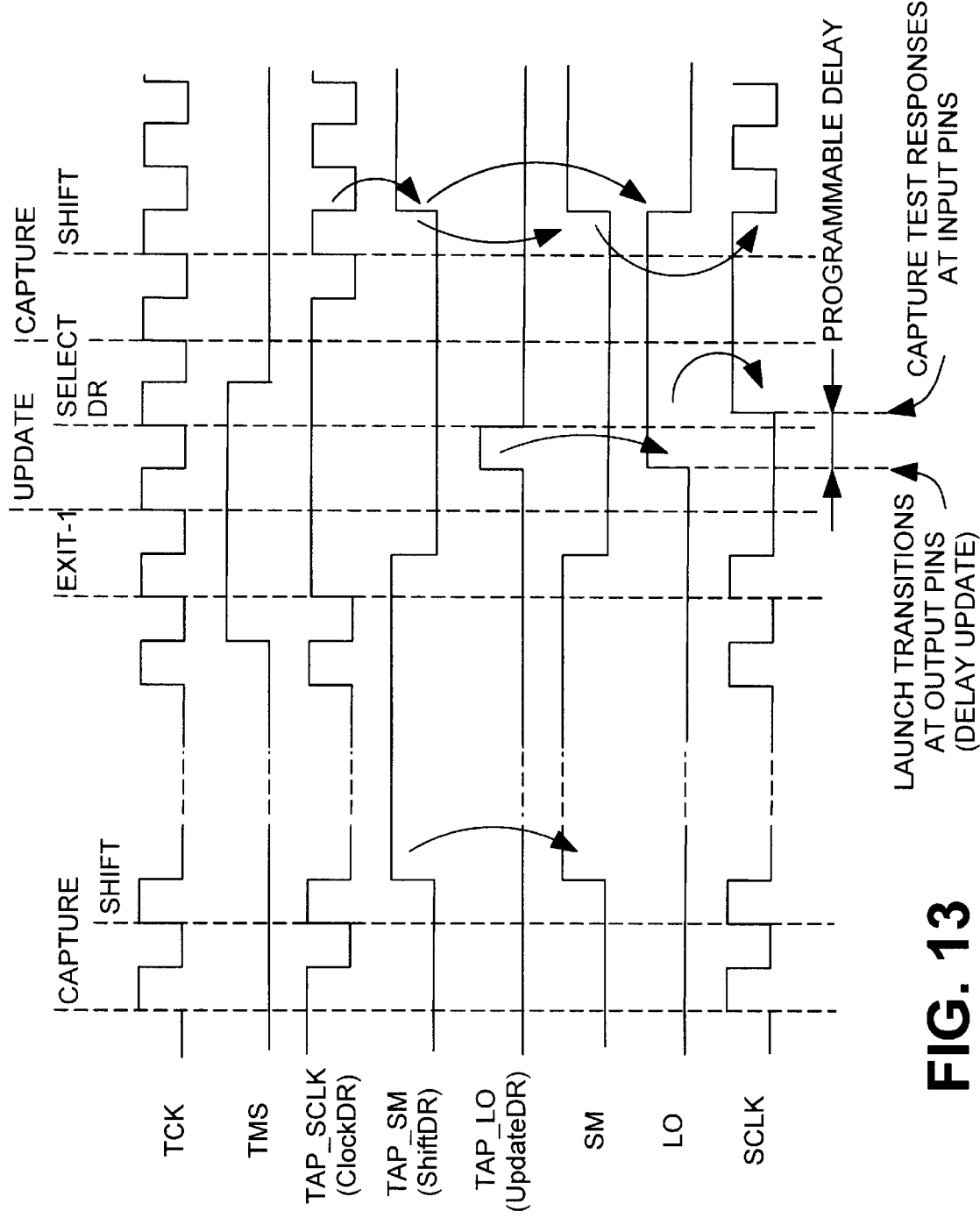
FIG. 13 shows signal waveforms in an interconnect delay fault test method according to another embodiment of the present invention.

In FIG. 13, the rising edge of the TAP_LO signal (UpdateDR), which is also the rising edge of signal LO, is used to launch transitions (normal IEEE 1149.1 update mode). This edge is delayed by a programmable amount to capture the test responses. Because it uses the standard TAP_LO to launch transitions, it is able to cover interconnect paths from commercial ICs to ASICs. The test procedure is the same as that described in relation to FIG. 4.

In terms of implementation, there are many possible ways. One is to generate the required signals directly from a TAP controller under the control of a custom-defined instruction. Once the instruction is shifted in, the TAP controller generates the control waveforms SM, LO and SCLK as defined in FIG. 13.

Figure 14:
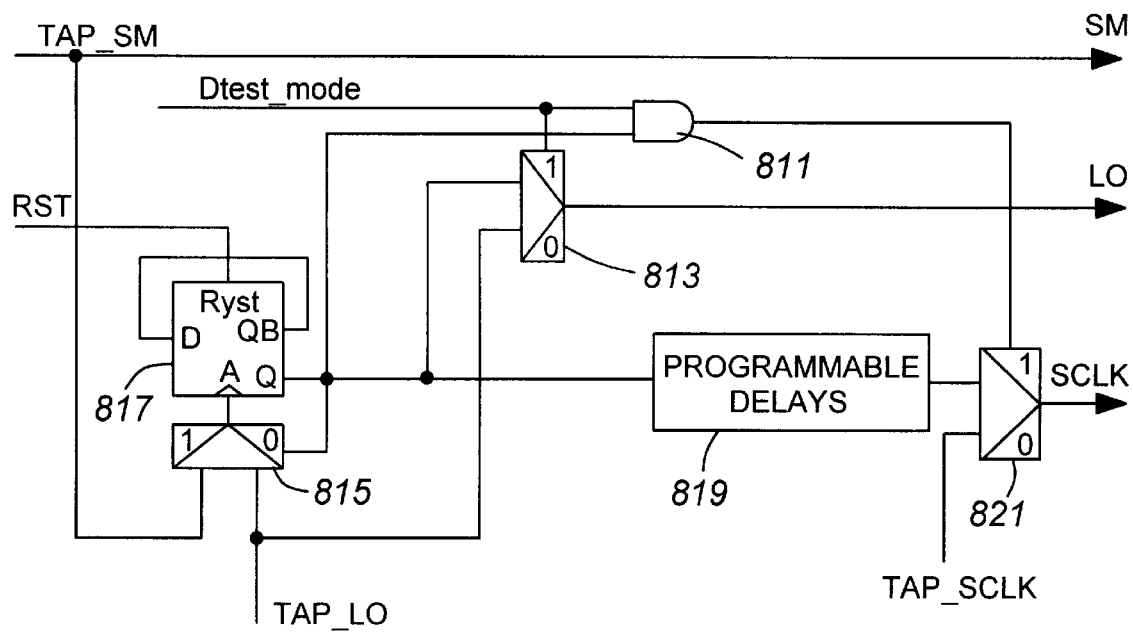
FIG. 14 is a block diagram of a circuit for generating boundary scan control signals.

FIG. 14 shows a circuit for generating boundary scan control signals. The circuit shown in FIG. 14 is an example of the modifier of the TAP controller of the IC chip 711 shown in FIG. 12. In FIG. 14, a test mode signal Dtest_mode is fed to an AND gate 811 and the selection terminal of a selector 813. A TAP scan mode the TAP_SM signal is fed to the 1 input terminal of a selector 815. A TAP_LO signal is fed to the 0 input terminals of the selectors 815 and 813. The output of the selector 815 is fed to the clock terminal of the D-FF 817. A reset signal RST is fed to a D-FF 817. The inverted output QB of the D-FF 817 is fed to its D input terminal. The non-inverted output Q of the D-FF 817 is fed to the selection terminal of the selector 815, the 1 input terminal of the selector 813, the AND gate 811 and a programmable delay circuit 819, the output of which is fed to the 1 input terminal of a selector 821, to the 0 input terminal of which a TAP_SCLK signal is fed. The output of the AND gate 811 is fed to the selection terminal of the selector 821, the output of which is a scan test clock control signal SCLK. The output of the selector 813 is a load control signal LO. The TAP_SM signal is a scan mode control signal SM.

The boundary scan control signal generator shown in FIG. 14 modifies the signals from a standard TAP controller to meet the delay fault testing requirements. Assume the standard TAP controller to generate the TAP_SCLK (ClockDR), TAP_SM (ShiftDR) and TAP_LO (UpdateDR) signals as shown in FIG. 13, which agree with those recommended by the IEEE 1149.1 standard.

IV. Others

There are many possible ways to implement the proposed technique with IEEE 1149.1. For example, one can implement the delay test with a custom-defined instruction. Once this instruction is shifted into the TAP controller's instruction register, the TAP generates the control waveforms defined in FIG. 3.

Figure 15:
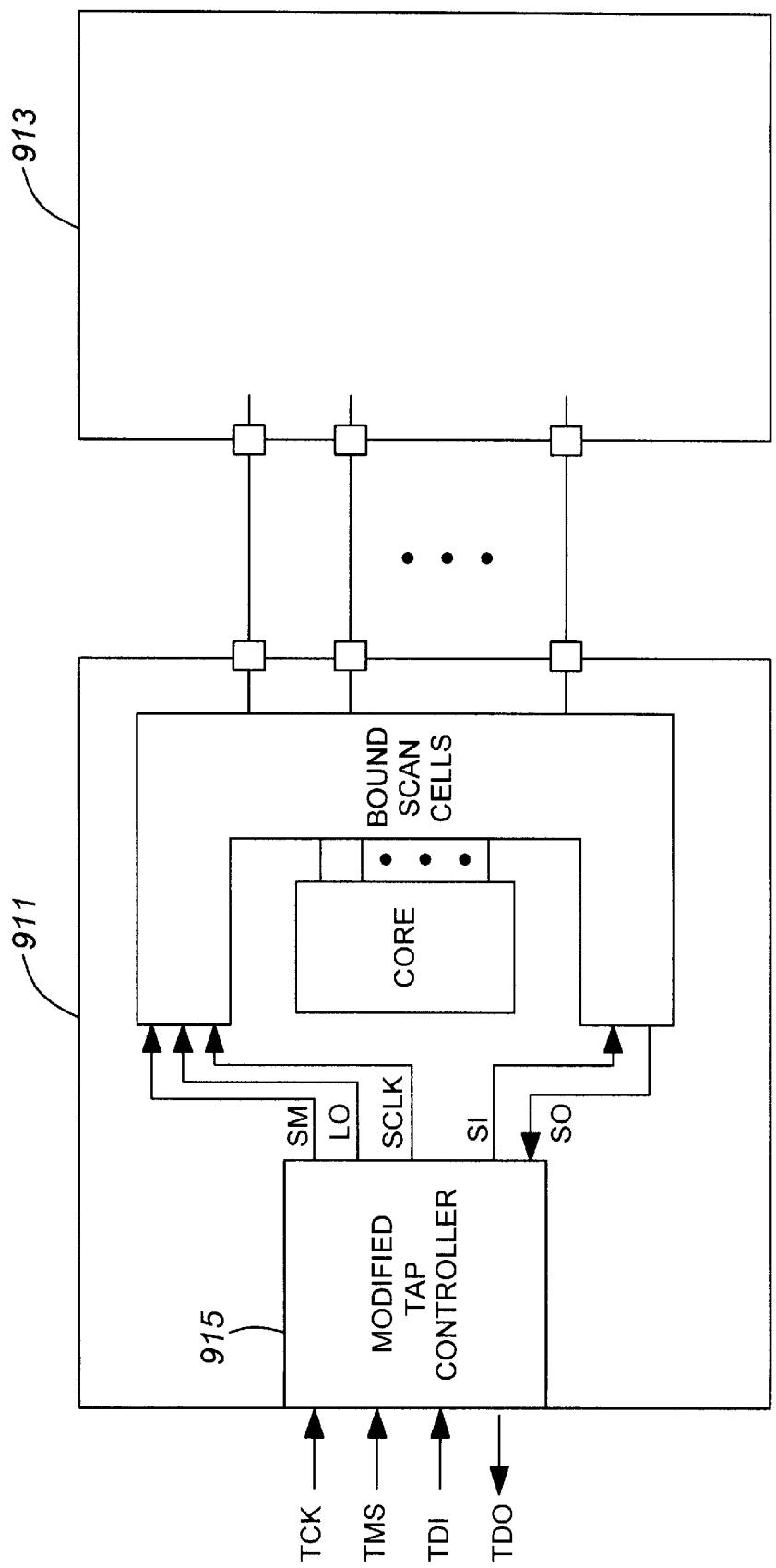
FIG. 15 illustrates two interconnected IC chips wherein a TAP controller according to another embodiment of the present invention is incorporated.

FIG. 15 shows another embodiment wherein two interconnected IC chips on a board. In FIG. 15, sending and receiving IC chips 911 and 913 are ASICs. Each of the IC chips 911 and 913 includes a modified TAP controller 915 performing IEEE 1149.1 standard TAP operations and modifying the standard signals. The TCK, TMS, TAP_SCLK, TAP_SM and TAP_LO signals are determined by standardized timing. The modified TAP controller 915 generates boundary scan control signals: a load control signal LO, a scan test clock control signal SCLK and a scan mode control signal SM, in response to the TCK, TMS, TAP_SCLK, TAP_SM and TAP_LO signals. The boundary scan control signals are provided to boundary scan cells included in the IC chip 911. In test mode operation, the boundary scan cells receive input data from the scan input TDI pin of the sending IC chip 911 and forward the data to a respective pad thereof which are interconnected to the counterparts of the receiving IC chip 913. This is another possible implementation of the interconnect fault delay test method to transform the control signals from a standard TAP controller to the desired waveforms shown in FIG. 3. The signal transformation can easily be done with a simple wrapper around the standard TAP controller. This transformation is under the control of a user-defined TDR. The advantages of this approach mainly include the savings of implementation time and the flexibility of using any IEEE 1149.1 compatible TAP controllers.

Also, FIG. 15 represents another embodiment similar to one shown in FIG. 12. In such a case, two interconnected IC chips 911 and 913 are receiving and sending chips, respectively. The sending chip 913 is a commercially available chip with the IEEE 1149.1 standard TAP controller, for example, a CPU. The receiving chip 911 is an ASIC. Where the IC chip 913 transmits a transition and the IC chip 911 with the delay testing capability captures the transition. The ASIC chip 911 can also transmit transitions and capture the transitions. An interconnect delay fault test method shown in FIG. 13 is performed.

In summation, characteristics of the above mentioned delay fault test method are summarized as follows:

It is based on the IEEE 1149.1 TAP operations. Thus, it does not rely on bed-of-nails. This makes the delay test portable from boards to systems.

It is compatible with the IEEE 1149.1 TAP operations. Therefore, interconnect delay test with the proposed technique is transparent to testers and test bus masters. Conventional interconnect DC test software can be used to conduct interconnect AC tests.

It does not require to add any extra pin to ASICs. Thus, it does not add extra routing overhead to board designs.

It uses the standard boundary scan cells. Thus, all boundary scannable pins in an ASIC are equipped with this delay test capability. This makes it possible for ASIC designers not worry about interconnect delay test at board and system levels. In addition, it also allows board and system designers to add new AC tests for any signals at any time without modification of ASICs.

It uses an IEEE 1149.1 compatible TAP controller. All the required circuitry can be included in a simple wrapper around the standard TAP controller. The delay tests do not change the TAP operations.

Although particular embodiments of the present invention have been described in detail, it should be appreciated that numerous variations, modifications, and adaptations may be made without departing from the scope of the present invention as defined in the claims.

What is claimed is:

1. A test access port (TAP) control method in use for delay fault test of interconnect between first and second integrated circuit (IC) chips, the method comprising the steps of:

performing IEEE 1149.1 standard TAP operations wherein test clock (TCK), test mode select (TMS), TAP scan test clock (TAP_SCLK), TAP scan mode (TAP_SM) and TAP load (TAP_LO) signals are determined by standardized timing;

generating a scan mode (SM) control signal in response to the TAP_SM signal;

generating a load (LO) control signal in response to the TAP_LO signal; and generating a scan test clock (SCLK) control signal in response to the TCK signal and the LO control signal.

2. The TAP control method of claim 1, wherein:

the step of generating a scan mode (SM) control signal comprises the step of activating the SM control signal in response to the TAP_SM signal;

the step of generating a load (LO) control signal comprises the step of activating the LO control signal in response to the TAP_LO signal; and the step of generating a scan test clock (SCLK) control signal comprises the step of activating the SCLK control signal in response to the activated LO control signal.

3. The TAP control method of claim 2, further comprising the step of transferring data stored in boundary scan cells included in the first IC chip to the second IC chip via the interconnect between the first and second IC chips, in response to the LO control signal.

4. The TAP control method of claim 3, further comprising the step of capturing the data transferred from the first IC chip by the second IC chip, in response to the SCLK control signal.

5. The TAP control method of claim 4, wherein the step of capturing comprises the step of storing the data transferred from the first IC chip in boundary scan cells included in the second IC chip.

6. The TAP control method of claim 5, wherein the step of activating the LO control signal comprises the step of activating the LO control signal in response to the succeeding edge of a pulse of the TAP_LO signal.

7. The TAP control method of claim 6, wherein the step of activating SCLK control signal comprises the step of activating the SCLK control signal in response to the preceding edge of a pulse of the activated LO control signal.

8. The TAP control method of claim 7, wherein the step of activating the SCLK control signal comprises the step of delaying the activating of the SCLK control signal in response to the preceding edge of the pulse of the activated LO control signal.

9. The TAP control method of claim 8, wherein the step of delaying the activating of the SCLK control signal comprises the step of programmably delaying the activating of the SCLK control signal by time delay changeable elements.

10. The TAP control method of claim 9, wherein the step of programmably delaying comprises the step of variably changing the time delay determined by the delay changeable elements.

11. The TAP control method of claim 10, further comprising the step of deactivating the activated SCLK control signal in response to the preceding edge of a pulse of the activated SM control signal.

12. The TAP control method of claim 2, further comprising the step of transferring data from the second IC chip to the first IC chip via the interconnect between the first and second IC chips, in response to the LO control signal.

13. The TAP control method of claim 12, further the step of capturing the data transferred from the second IC chip by the first IC chip, in response to the SCLK control signal.

14. The TAP control method of claim 13, wherein the step of capturing comprises the step of storing the data transferred from the second IC chip in boundary scan cells included in the first IC chip.

15. The TAP control method of claim 14, wherein the step of activating the LO control signal comprises the step of activating the LO control signal in response to the preceding edge of a pulse of the TAP_LO signal.

16. The TAP control method of claim 15, wherein the step of activating SCLK control signal comprises the step of activating the SCLK control signal in response to the preceding edge of a pulse of the activated LO control signal.

17. The TAP control method of claim 16, wherein the step of activating the SCLK control signal comprises the step of delaying the activating of the SCLK control signal in response to the preceding edge of the pulse of the activated LO control signal.

18. The TAP control method of claim 17, wherein the step of delaying the activating of the SCLK control signal comprises the step of programmably delaying the activating of the SCLK control signal by time delay changeable elements.

19. The TAP control method of claim 18, wherein the step of programmably delaying comprises the step of variably changing the time delay determined by the delay changeable elements.

20. The TAP control method of claim 19, further comprising the step of deactivating the activated SCLK control signal in response to the preceding edge of a pulse of the activated SM control signal.

21. An apparatus for conducting delay fault test of interconnect between first and second IC chips, the apparatus comprising a test access port (TAP) controller, the TAP controller performing IEEE 1149.1 standard TAP operations wherein test clock (TCK), test mode select (TMS), TAP scan test clock (TAP_SCLK), TAP scan mode (TAP_SM) and TAP load (TAP_LO) signals are determined by standardized timing;

the TAP controller generating means for generating scan mode (SM), load (LO) and scan test clock (SCLK) control signals, in response to the TAP_SM, the TAP_LO and the TCK signals.

22. The apparatus of claim 21, wherein each of the first and second IC chips comprises the TAP controller and boundary scan cells, the TAP controller comprising:

means for generating the SM control signal in response to the TAP_SM signal;

load control means for generating the LO control signal in response to the TAP_LO signal; and scan test clock means for generating the SCLK control signal in response to the TCK signal and the LO control signal.

23. The apparatus of claim 22, wherein the TAP controller of the first IC chip further comprises means for transferring data stored in the boundary scan cells of the first IC chip to the boundary scan cells of the second IC chip via the interconnect between the first and second IC chips.

24. The apparatus of claim 23, wherein the TAP controller of the second IC chip further comprises means for capturing the data transferred from the first IC chip.

25. The apparatus of claim 24, wherein the load control means comprises means for activating the LO control signal in response to the succeeding edge of a pulse of the TAP_LO signal.

26. The apparatus of claim 25, wherein the scan test clock means comprises means for activating the SCLK control signal comprises the step of activating the SCLK control signal in response to the preceding edge of a pulse of the activated LO control signal.

27. The apparatus of claim 26, wherein the means for activating the SCLK control signal comprises means for delaying the activating of the SCLK control signal in response to the preceding edge of the pulse of the activated LO control signal.

28. The apparatus of claim 27, wherein the means for delaying the activating of the SCLK control signal comprises variable time delay means for programmably delaying the activating of the SCLK control signal.

29. The apparatus of claim 28, wherein the variable time delay means comprises a series-connected delay elements having a plurality of taps connected to the delay elements, the outputs from the taps determining different delay times.

30. The apparatus of claim 29, wherein the TAP controller of the first IC chip further comprises means for deactivating the activated SCLK control signal in response to the preceding edge of a pulse of the activated SM control signal.

31. The apparatus of claim 22, wherein the first IC chip comprises the TAP controller and boundary scan cells, the TAP controller comprising:
means for generating the SM control signal in response to the TAP_SM signal;
load control means for generating the LO control signal in response to the TAP_LO signal; and
scan test clock means for generating the SCLK control signal in response to the TCK signal and the LO control signal.

32. The apparatus of claim 31, wherein the TAP controller further comprises means for storing data in the boundary scan cells, the data being transferred from the second IC chip via the interconnect between the first and second IC chips.

33. The apparatus of claim 32, wherein the TAP controller further comprises means for capturing the data stored in the boundary scan cells.

34. The apparatus of claim 33, wherein the load control means comprises means for activating the LO control signal in response to the preceding edge of a pulse of the TAP_LO signal.

35. The apparatus of claim 34, wherein the scan test clock means comprises means for activating the SCLK control signal comprises the step of activating the SCLK control signal in response to the preceding edge of a pulse of the activated LO control signal.

36. The apparatus of claim 35, wherein the means for activating the SCLK control signal comprises means for delaying the activating of the SCLK control signal in response to the preceding edge of the pulse of the activated LO control signal.

37. The apparatus of claim 36, wherein the means for delaying the activating of the SCLK control signal comprises variable time delay means for programmably delaying the activating of the SCLK control signal.

38. The apparatus of claim 37, wherein the variable time delay means comprises a series-connected delay elements having a plurality of taps connected to the delay elements, the outputs from the taps determining different delay times.

39. The apparatus of claim 38, wherein the control signal generating further comprises means for deactivating the activated SCLK control signal in response to the preceding edge of a pulse of the activated SM control signal.

40. The apparatus of claim 39, wherein the control signal generating further comprises means for deactivating the activated SCLK control signal in response to the preceding edge of a pulse of the activated SM control signal.

41. The apparatus of claim 40, wherein the TAP controller comprises:
means for performing the IEEE 1149.1 standard TAP operations to generate the IEEE 1149.1 standard TAP signals; and
means for generating the SM control signals in response to the IEEE 1149.1 standard TAP signals.

42. A method for performing IEEE 1149.1 standard TAP operations, the method comprising the steps of:
performing as defined by the IEEE 1149.1 standard, so that test clock (TCK), test mode select (TMS), TAP scan test clock (TAP_SCLK), TAP scan mode (TAP_SM) and TAP load (TAP_LO) signals are determined by standardized timing;
generating a scan mode (SM) control signal which is activated in response to the transition of a pulse of the TAP_SM signal;
generating a load (LO) control signal which is activated in response to the transition of a pulse of the TAP_LO signal; and
generating a scan test clock (SCLK) control signal which is activated in response to the transition of a pulse of the activated LO control signal.

43. The method of claim 42, wherein:
the step of generating a load (LO) control signal comprises the step of activating the LO control signal in response to the succeeding edge of the pulse of the TAP_LO signal; and
the step of generating a scan test clock (SCLK) control signal comprises the step of activating SCLK control signal in response to the preceding edge of the pulse of the activated LO control signal.

44. The method of claim 43, wherein the step of activating SCLK control signal comprises the step of delaying the activating of the SCLK control signal from the preceding edge of the pulse of the activated LO control signal.

45. The method of claim 42, wherein:
the step of generating a load (LO) control signal comprises the step of activating the LO control signal in response to the preceding edge of the pulse of the TAP_LO signal; and
the step of generating a scan test clock (SCLK) control signal comprises the step of activating SCLK control signal in response to the preceding edge of the pulse of the activated LO control signal.

46. The method of claim 45, wherein the step of activating SCLK control signal comprises the step of delaying the activating of the SCLK control signal from the preceding edge of the pulse of the activated LO control signal.

* * * * *